Figure 1:
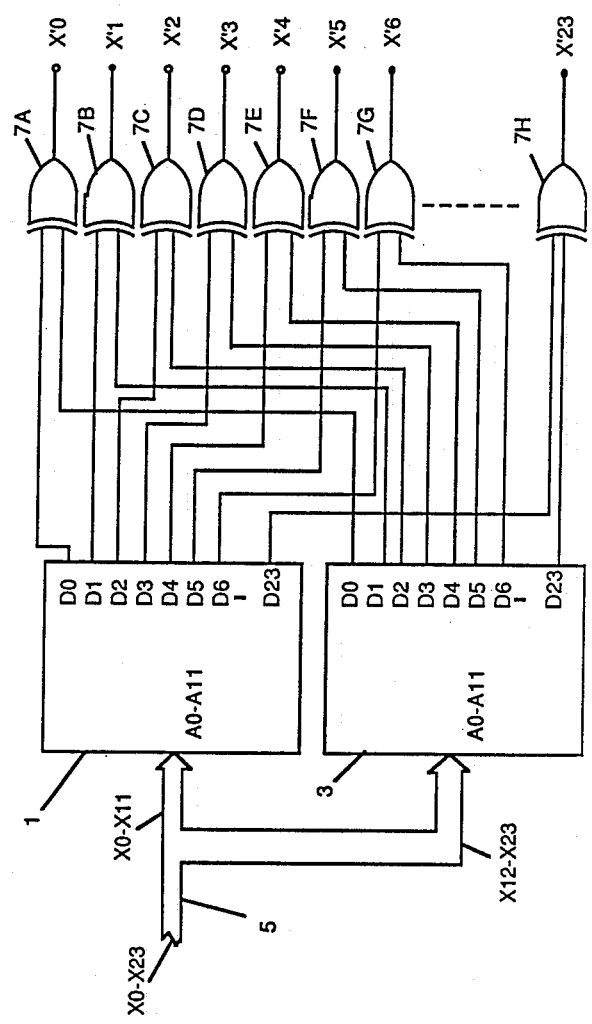

United States Patent [19]

Anderson

[11] Patent Number: 4,782,488
[45] Date of Patent: Nov. 1, 1988

[54] DIGITAL SIGNAL SCRAMBLER

[75] Inventor: Duane L. Anderson, Carp, Canada

[73] Assignee: Mosaid Technologies Inc., Canada

[21] Appl. No.: 44,103

[22] Filed: Apr. 29, 1987

[30] Foreign Application Priority Data

May 6, 1986 [CA] Canada .................................. 508494

[51] Int. Cl.$^4$ ........................................... G01R 31/28
[52] U.S. Cl. .................................................. 371/27
[58] Field of Search ................ 371/2, 21, 27; 364/900

[56] References Cited

U.S. PATENT DOCUMENTS

| | | | |
|---|---|---|---|
| 4,287,594 | 9/1981 | Shirasaka | 371/27 X |
| 4,300,234 | 11/1981 | Maruyama et al. | 371/27 |
| 4,442,519 | 4/1984 | Jones et al. | 371/27 |
| 4,598,245 | 7/1986 | Groves et al. | 371/27 X |
| 4,670,879 | 6/1987 | Okino | 371/27 |
| 4,682,330 | 7/1987 | Millham | 371/27 X |
| 4,730,319 | 3/1988 | David et al. | 371/27 |

Primary Examiner—Charles E. Atkinson
Attorney, Agent, or Firm—Laff, Whitesel, Conte & Saret

[57] ABSTRACT

A digital signal scrambler for use in testing semiconductor memory circuits such as RAMs. The scrambler is comprised of look-up tables in conjunction with EXCLUSIVE OR logic circuitry, for receiving generated address and data signals and transmitting scrambled signals in response thereto, conforming to the predefined topological scrambling function of the memory circuit being tested. The digital signal scrambler of the present invention is of simple and inexpensive design, is easy to use and typically occupies very little circuit board area.

20 Claims, 3 Drawing Sheets

DIGITAL SIGNAL SCRAMBLER

This invention relates in general to memory testing, and in particular to an address and data signal scrambler for use in testing electronic memory circuits.

Modern day semiconductor memory manufacturers, as well as users of semiconductor memory circuits, frequently utilize memory testing devices, or memory testers for detecting faulty circuits, thereby facilitating sorting of good and bad circuits. In addition, engineers and scientists typically utilize sophisticated research oriented memory testers for investigating the signal storage characteristics of individual memory cells of the circuits.

In order to test a memory circuit, a memory tester typically generates address signals for accessing predetermined memory cells of the circuit and generates data signals for storage therein. The tester then retrieves the data signals stored in the accessed cells, and compares them with the data originally generated.

Memory circuits such as Random Access Memories (RAMs) typically incorporate internal address and data decoding circuitry for accessing the aforementioned memory cells and storing or retrieving inverted or non-inverted versions of the data signals thereon, according to a predefined topological scrambling function. In general, the internal address decoding circuitry scrambles the address signals applied thereto in a complex manner, such that there is typically a non-trivial correlation between the address signal applied to the circuit and the actual memory cell addressed.

For instance, individual bits of an address signal applied to the memory circuit may be interchanged, inverted or otherwise manipulated in order to access a predetermined one or more memory cells. Similarly, predetermined bits of the data signals applied to the memory circuit may be inverted or interchanged prior to storage on the one or more accessed memory cells.

Consequently, in the event that it is desired to analyze a specific memory circuit to determine the exact location of faulty cells, research oriented memory testers must also scramble the generated address and data signals applied to the memory circuit, so as to conform to the aforementioned predefined topological scrambling function which is a characteristic of the address and data decoding circuitry of the memory circuit.

Memory cells within a memory circuit, such as a RAM, are laid out in a two dimensional array and identified by ordered pairs of interger values (X, Y), known as coordinates. Hence, research oriented memory testers generate a specific address signal (defined by the X and Y coordinates), and a data signal, and scramble one or both of the generated address and data signals for application to the memory circuit. The memory circuit subsequently decodes the scrambled address and data signals such that the aforementioned specific data signal is stored in the memory location or cells designated by the generated specific address signal, as defined by the aforementioned X and Y coordinates.

One approach to accommodating various address scrambling schemes within prior art memory testers was to provide means for physically cross-connecting and interchanging selected address lines extending from the tester to the circuit, or Device Under Test (DUT). Since individual types of memory circuits typically each employ proprietary topological address and data scrambling schemes, the prior art approach has been found to be cumbersome to research scientists and engineers who typically must switch quickly from one scrambling scheme to another in order to compare the characteristics of a plurality of circuits.

A second prior art approach to address and data signal scrambling required the use of large programmable look-up tables, loaded with scrambled address signals corresponding to each generated address and data signal. For example, in the event a 256k bit memory was being tested, a large 256k by 18 bit look-up table would be required to be loaded by an external microprocessor or other controller with all of the individual scrambled address signals. Similarly, in order to test a larger memory (eg., 16 Mbit by 24 bits), a prohibitively large look-up table would be required.

According to the present invention, a digital signal scrambler is provided which utilizes a plurality of relatively small and inexpensive look-up tables in conjunction with EXCLUSIVE OR logic circuitry, for receiving generated address and data signals and transmitting scrambled digital signals in response thereto, conforming to the predefined topological scrambling function of the memory circuit being tested. According to a successful prototype of the invention substantial savings in size and cost were obtained over prior art memory testers.

Figure 2:
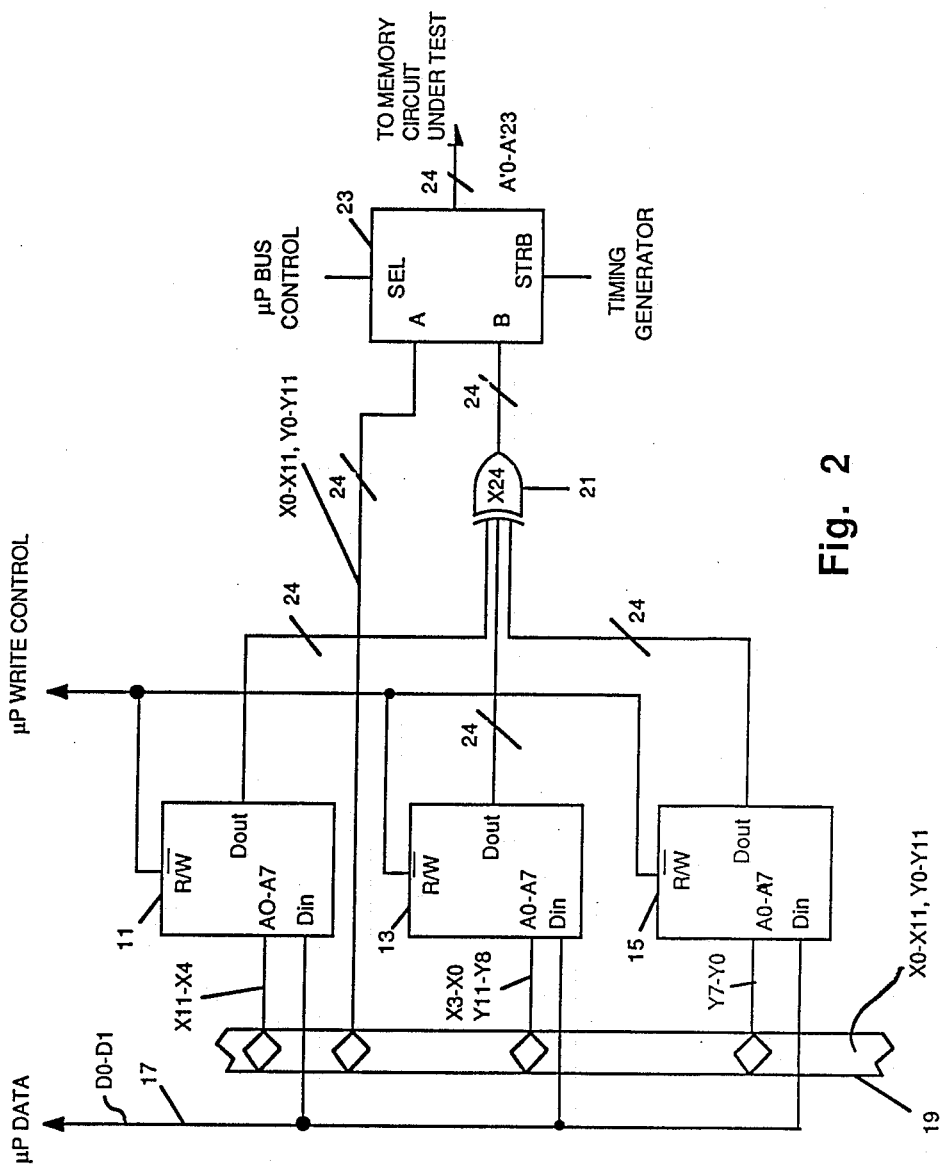
Figure 3:
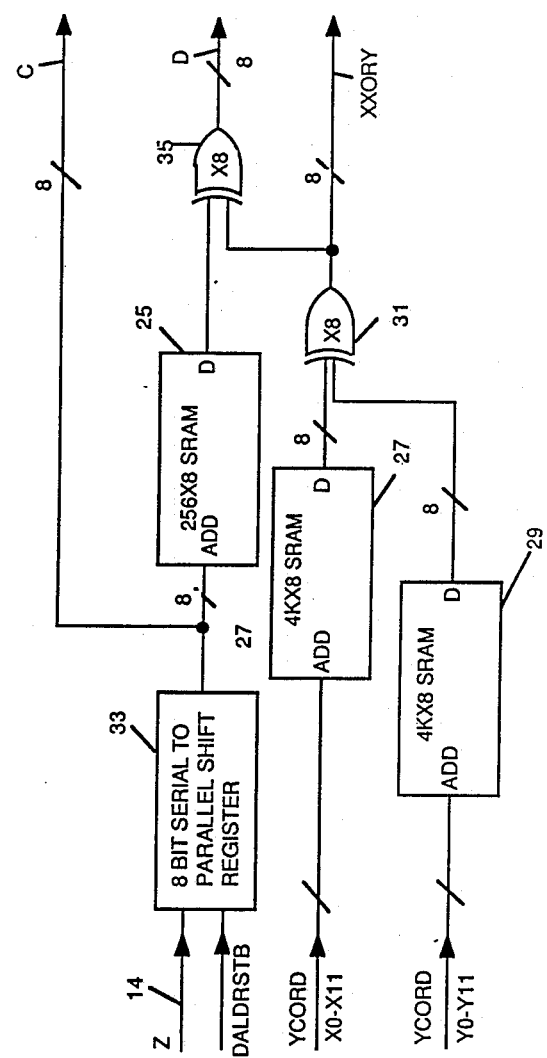

A better understanding of the present invention will be obtained by reference to the detailed description below in conjuction with the following drawings, in which:

FIG. 1 is a block schematic of a digital signal scrambler according to the present invention, FIG. 2 is a schematic diagram of a digital address signal scrambler according to a first embodiment of the present invention, and FIG. 3 is a schematic diagram of a digital data signal scrambler according to a second embodiment of the present invention.

With reference to FIG. 1, a pair of look-up table memory circuits 1 and 3 are shown having address inputs A0–A11 connected to individual 12 bit lines of a digital signal bus 5 for carrying a 24 bit digital input signal X0–X23, which could be for instance, a generated address signal, or a generated data signal to be applied to a memory circuit being tested. Data terminals D0–D23 of memory circuits 1 and 3 are connected to the inputs of 24 2-input EXCLUSIVE OR gates 7A, 7B, ..., 7H. Outputs of the gates 7A–7H carry scrambled digital output signals X'0–X'23, respectively.

In operation, memory circuits 1 and 3 are loaded with intermediate scrambled signals via an external microprocessor or other controller (not shown), in a well known manner. The 24 bit digital input signal X0–X23 is carried by signal bus 5 and separated into first and second 12 bit portions X0–X11 and X12–X23 which are applied to the look-up table memory circuits 1 and 3, respectively. Each of the memory circuits 1 and 3 generate an intermediate scrambled digital signal on the D0–D23 terminals thereof for application to respective ones of EXCLUSIVE OR gates 7A–7H. EXCLUSIVE OR gates 7A–7H then logically combine the intermediate scrambled digital signals and generate a final scrambled digital output signal X'0–X'23 in response thereto.

Considering the theory of operation of the present invention, the scrambled output digital signal can be represented in vector notation as follows:

$$[X'23, X'22, \ldots, X'0] = [X11, X10, \ldots, X0, X23, X22, \ldots, X12] \begin{bmatrix} P \\ Q \end{bmatrix}$$

where $X'23, X'22, \ldots, X'0$ are individual bits of the scrambled output signal; $X11, X10, \ldots, X0$ and $X23, X22, \ldots, X12$ are individual bits of the aforementioned input digital signal X0–X23, applied to memory circuits 1 and 3 respectively, and P and Q are each 12 by 24 element Boolean dyadic submatrices representing a scrambling function, which in a preferred embodiment corresponds to the inverse of the aforementioned topological scrambling function of the memory circuit being tested.

It was realized that since the EXCLUSIVE OR operation is associative, the above vector notation equation scrambling relation can be represented as follows:

$$[X'23, X'22, \ldots, X'0] = [X11, X10, \ldots, X0][P] \text{ XOR } [X23, X22, \ldots, X12][Q]$$

For example, in the event it is desired to scramble the input digital signal such that the first scrambled output bit X'0 is produced by EXCLUSIVE OR'ing the X2, X11 and X15 bits, memory circuit 1 is first loaded via the external microprocessor, with a plurality of predetermined intermediate scrambled digital signals characterized by elements of the P matrix, wherein a logic low signal is stored in the D0 bit for each location defined by an input digital signal having the X2 and X11 bits either both logic low or logic high, and a logic high signal is stored in the D0 bit for each location defined by an input digital address signal having one of the X2 or X11 bits at a logic high level and the other at a logic low level.

Similarly, memory circuit 3 is loaded with intermediate scrambled signals characterized by elements of the Q matrix, wherein a logic high signal is stored in the D0 output for each location defined by an input address signal having the X15 input signal bit at a logic high level.

The outputs of memory circuits 1 and 3 are EXCLUSIVE OR'd in gates 7A–7H in response to a signal being received on signal bus 5 such that the D0 bits of both memory circuits 1 and 3 are EXCLUSIVE OR'd in gate 7A, thereby generating the desired scrambled output signal X'0–X'23 wherein the output bit X'0 is generated by EXCLUSIVE OR'ing the X2, X11 and X15 input digital signal bits.

In this manner, any predetermined scrambling function is accommodated for each output bit of the scrambled signal X'0–X'23. However, since only 12 input signal bits are required to address each of the memory circuits 1 and 3, only a pair of 4k by 24 bit look-up table memories are utilized, in contrast to the prohibitively large look up table that would have been required according to the aforementioned second prior art approach.

As discussed above, it was realized that many scrambling functions can be represented in Boolean notation by a combination of EXCLUSIVE OR operations on each of the digital input signal bits to generate each scrambled output bit. Memory circuits 1 and 3 can alternatively be loaded with scrambled signals for generating output signal bits which correspond to non-EXCLUSIVE OR operations (such as NAND, NOR, AND, OR), on the digital input signal bits. However, it was realized that any function that cannot be implemented with an EXCLUSIVE OR operation is not required for the purpose of testing memory circuits since a memory circuit which scrambles input signals according to non-EXCLUSIVE OR operations would be required to exhibit redundant addressing capabilities, which is not common in commercially available memory circuits but may have curiosity value to a researcher.

Such non-EXCLUSIVE OR functions can be useful however, for generating background patterns across cells adjacent to the memory cells being accessed in the memory circuit under test, in order to determine the influence on the accessed cells of activity on these adjacent cells. For example, a particular memory cell may be able to store both logic high and logic low level signals if the adjacent cell has a logic low level signal stored thereon, yet the cell may be able to retain only a logic low level signal in the event the adjacent cell has a logic high level signal stored thereon. Circuit failures of this variety are dependent upon data patterns present in the circuit and are thus known as "pattern-sensitive" failures.

Referring to FIG. 2, a first successful embodiment of the present invention is illustrated wherein address signals are scrambled for subsequent application to a memory circuit being tested.

Three look-up table memory circuits 11, 13 and 15 are shown having data inputs $D_{in}$ connected to a data bus 17 carrying data signals D0–D11, and address inputs $A_0$–$A_7$ are connected to predetermined address lines of an address bus 19 carrying 24 bit digital address signals X0–X11 and Y0–Y11, corresponding to the X and Y coordinates discussed above for addressing a two dimensional square array of cells in memory circuits.

The address inputs $A_0$–$A_7$ of memory circuit 11 receive the $X_{11}$–$X_4$ address signals from address bus 19, the $A_0$–$A_7$ inputs of circuit 13 receive the $X_3$–$X_0, Y_1$–$Y_8$ address signals, and the $A_0$–$A_7$ inputs of circuit 15 receive the $Y_7$–$Y_0$ signals.

Twenty-four bit data output terminals $D_{out}$ of memory circuits 11, 13 and 15 are connected to the inputs of 24, 3-input EXCLUSIVE OR gates denoted in FIG. 2 by numeral 21. Twenty-four outputs of the EXCLUSIVE OR gates 21 are connected to the B inputs of a 48 bit input to 24 bit output multiplexer 23 which, for instance, can be comprised of six separate eight bit input to four bit output multiplexers. The A inputs of multiplexer 23 are connected to address bus 19 for receiving the $X_0$–$X_{11}, Y_0$–$Y_{11}$ address signals. A select input SEL of multiplexer 23 is connected to a control bus of the external microprocessor, and a strobe input STRB is connected to a timing generator for generating control and timing signals (not shown). A 24 bit data output OUT of multiplexer 23 generates a scrambled address signal A'0–A'23 for application to the memory circuit under test.

Write control inputs of memory circuits 11, 13 and 15 are connected to a microprocessor write control circuit, (not shown) for controlling loading and accessing the memory circuits.

As discussed above with reference to FIG. 1, it was realized that any one-to-one scrambling function by which an input signal comprised of a predetermined number of bits is scrambled so as to generate a unique scrambled output signal having the same number of bits, can be expressed in Boolean vector notation as a series of unique EXCLUSIVE OR functions of predetermined ones of the input signals with each other.

Thus, considering a 24 bit input signal, the scrambling function may be represented as follows:

$$[A'23, A'22, \ldots, A'0] = [X_{11}, \ldots, X_4, X_3, \ldots, X_0, X_{11}, \ldots, Y_8, Y_7, \ldots Y_0] \begin{bmatrix} P \\ Q \\ R \end{bmatrix}$$

And since the EXCLUSIVE OR function is associative $$[A'23, A'22, \ldots, A'0] = [X_{11}, \ldots X_4][P] \text{XOR}[X_3, \ldots, X_0, Y_{11}, \ldots, Y_8][Q] \text{XOR}[Y_7, \ldots, Y_0][R]$$

The external microprocessor (not shown) generates data signals D0–D11 for application to the data bus 17 and storage in the memory circuits 11, 13 and 15, and also generates control signals for application to the memory circuits and to the multiplexer 23. For example, a write control signal is applied to the R/$\overline{W}$ inputs of memory circuits 11, 13 and 15 in order to control the storage of data signals D0–D11 in the memory circuits during initialization of the device, and to control read operations during operation of the device. The data signals D0–D11 correspond to the aforementioned predefined intermediate scrambling signal. Also, a bus control signal is applied to the select input SEL of multiplexer 23 in order to select between the 24 scrambled signal outputs of the EXCLUSIVE OR gates 21 or the unscrambled signals appearing directly on address bus 19, in order to bypass the scrambling circuit.

In a successful prototype of the invention, memory circuits 11, 13 and 15 were 256×24 bit random access memories.

In operation, the 256 locations of the memory circuits 11, 13 and 15 are initially loaded by the microprocessor with the aforementioned intermediate scrambling signals according to the inverse of the topological address decoding scrambling function of the memory circuit under test. As discuss above, the scrambling function can adopt a number of different characteristics. For instance, one bit of the address signal $X_0, \ldots, X_{11}, Y_0, \ldots, Y_{11}$ may be transposed with another, or inverted. Thus, each of the memory circuits 11, 13 and 15 is loaded with intermediate scrambling signals corresponding to the 256 possible combinations of signals appearing on the address lines of bus 19 connected to the $A_0$–$A_7$ inputs of the individual circuits 11, 13 and 15. For example, in the event the topological scrambling function requires that the X0 input signal bit be transposed with the A'8 scrambled output bit, a logic high signal is stored in the D8 bit of each location in memory circuit 13 for which the X0 input signal bit is at a logic high level, and the D8 bits in memory circuits 11 and 15 are set to logic low levels in order that the signals appearing on the inputs of the corresponding one of EXCLUSIVE OR gates 21 are comprised of a logic high signal and two logic low signals, such that the output of the corresponding EXCLUSIVE OR gate generates a logic high signal.

Alternatively, to invert a signal, a logic high signal can be loaded into the corresponding data bit of one of the memory circuits 13 or 15.

In this manner, memory circuits 11, 13 and 15 can be loaded with intermediate scrambling signals corresponding to any possible logical function (AND, OR, NAND, NOR, XOR, etc.,) of the 8 bit input address signals applied thereto according to the known topological scrambling function of the memory circuit under test. However, as discussed above, for practical devices only XOR functions need be accommodated.

The signal scrambler may be bypassed by applying a logic high signal to the bus control line applied to the SEL input of multiplexer 23, whereby the address signals appearing on address bus 19 are applied directly to the memory circuit under test, and are not scrambled.

In the successful prototype, signals appearing on address bus 19 were generated by an address signal pattern generator, for generating predetermined digital signal sequences for addresssing predetermined cells on the memory circuit under test according to a predefined pattern, in a well known manner.

The embodiment of FIG. 2 is directed to digital signal scrambling for the purposes of scrambling address signals. However, as discussed above data signals must also frequently be scrambled. For example, a given data bit applied to the data input of a RAM circuit may in fact be inverted prior to storage thereon, and re-inverted in response to a read operation.

With reference to FIG. 3, a digital data signal scrambler is illustrated according to a second embodiment of the present invention. Address signals are scrambled in memory circuits 27 and 29 according to the method described with reference to FIG. 1, and combined in EXCLUSIVE OR gates 31. Data signals, denoted as Z, are received from a serial line 14, and shifted into an 8 bit serial-to-parallel shift register 33. The data signal can alternatively be received in parallel format, in which case register 33 may be eliminated. Serial data signals are converted in register 33 to 8 bit parallel format and output therefrom in response to receiving a strobe signal DADDRSTB, from the external microprocessor. The 8 bit parallel data signals are applied to address inputs ADD of memory circuit 25 which in response generates an intermediate 8 bit scrambled signal corresponding to each of the 256 possible generated data signals, in the manner described above with reference to FIGS. 1 and 2.

The intermediate scrambled data signals are combined with the intermediate scrambled address signals from the eight 2-input EXCLUSIVE OR gates 31 in eight further 2-input EXCLUSIVE OR gates denoted as 33. Thus, the intermediate scrambled data signals are further scrambled in relation to the generated address signals since data scrambling which occurs in the memory circuit under test is related to the particular address cells being accessed.

The generated data signal, denoted as C, and the intermediate scrambled address signals denoted as X XOR Y are transmitted to a pair of delay registers, not shown. The scrambled data signals, denoted as D, are applied to the memory circuit under test.

Upon retrieval of data signals from the memory circuit under test, the delayed intermediate address signals X XOR Y are EXCLUSIVE OR'd with descrambled received data signals from the memory circuit under test, and compared with the generated data signals C to determine whether there as been an error in the accessed cells of the memory circuit under test.

A person understanding the present invention may conceive of further modifications or variations thereof. While 24 bit signal scramblers have been discussed herein above, it will be understood that, according to the principles of the present invention, signal scramblers may be designed for scrambling digital signals comprised of more or less than 24 bits. For example, a 16 bit signal scrambler can be constructed from four 16×16 bit RAMs and sixteen 4-input EXCLUSIVE OR gates; or one 256×16 bit RAM, two 16×16 bit RAMs and sixteen 3-input EXCLUSIVE OR gates.

Likewise, while digital signal scramblers have been described herein utilizing two or three look-up tables and associated EXCLUSIVE OR gates, a greater number of smaller capacity look-up table memory circuits could be utilized. For example, in the case of a 24 bit signal, four 64×24 bit RAMs and twenty-four 4-input EXCLUSIVE OR gates could be used. In the limit, there could be twenty-four 1×24 bit RAMs and twenty-four 24-input EXCLUSIVE OR gates. However, it will be understood that with larger numbers of look-up table memories fewer non-EXCLUSIVE OR logical functions can be supported.

All such variations are within the sphere and scope of the present invention as defined by the claims appended hereto.

I claim:
1. A digital signal scrambler, comprised of:
   (a) means for receiving a digital input signal comprised of a plurality of bits,
   (b) a plurality of memory circuits for storing a plurality of intermediate scrambled digital signals,
   (c) means for addressing respective ones of said memory circuits with predetermined ones of said bits such that each of said memory circuits generates a predetermined one of said intermediate scrambled signals, and
   (d) a plurality of logic circuits for receiving said intermediate scrambled signals, performing an EXCLUSIVE OR function thereon and generating a scrambled digital output signal in response thereto, whereby a unique scrambled output signal is generated for each possible input signal according to the form of said stored intermediate scrambled signals.

2. A digital signal scrambler as defined in claim 1 wherein said memory circuits are storage registrs having respective data outputs thereof connected to respective inputs of said plurality of logic circuits.

3. A digital signal scrambler as defined in claim 2 wherein each of said logic circuits is comprised of an EXCLUSIVE OR gate.

4. A digital signal scrambler as defined in claim 1, wherein said digital input signal is comprised of 24 bits, said plurality of memory circuits is comprised of a pair of 4k byte random access memories, and said plurality of logic circuits is comprised of 24 2-input EXCLUSIVE OR gates having inputs connected to respective data outputs of each of said random access memories.

5. A digital signal scrambler as defined in claim 1, wherein said digital input signal is comprised of 24 bits, said plurality of memory circuits is comprised of three 256 byte random access memories, and said plurality of logic circuits is comprised of twenty-four 3-input EXCLUSIVE OR gates having inputs connected to respective data outputs of each of said random access memories.

6. A digital signal scrambler, comprised of:
   (a) means for receiving a digital input signal comprised of a plurality of bits denoted as N,
   (b) a plurality of memory circuits for storing a plurality of intermediate scrambled digital signals each comprised of N bits,
   (c) means for addressing respective ones of said memory circuits with predetermined bits of said plurality of bits comprising said digital input signal, such that each of said memory circuits generates a predetermined one of said intermediate scrambled signals, and
   (d) a plurality of logic circuits equal in number to N, each logic circuit having a plurality of inputs equal in number to said plurality of memory circuits, connected to respective outputs of said memory circuits, for receiving said intermediate scrambled signals, performing EXCLUSIVE OR functions thereon, and generating a scrambled digital output signal having N bits in response thereto, whereby a unique scrambled output signal is generated for each possible input signal according to the form of said stored intermediate scrambled signals.

7. A digital signal scrambler as defined in claim 6, wherein N equals 24, said plurality of memory circuits is comprised of a pair of 4k byte random access memories, and said plurality of logic circuits is comprised of twenty four 2-input EXCLUSIVE OR gates having inputs connected to respective outputs of each of said random access memories.

8. A digital signal scrambler as defined in claim 6, wherein N equals 24, said plurality of memory circuits is comprised of three 256 byte random access memories, and said plurality of logic circuits is comprised of twenty four 3-input EXCLUSIVE OR gates having inputs connected to respective data outputs of each of said random access memories.

9. A digital signal scrambler as defined in claim 6, wherein said digital input signal is comprised of an X and Y coordinate address signal for addressing a predetermined memory cell in a random access memory, and said scrambled digital output signal is a scrambled address signal for application to said random access memory which in response descrambles said scrambled signal according to a predetermined characteristic topological scrambling function and accesses said predetermined memory cell.

10. A digital signal scrambler as defined in claim 6, wherein said digital input signal is a data signal for storage in a predetermined one or more memory cells of a random access memory, and said scrambled digital output signal is a scrambled data signal for application to said random access memory which in response descrambles said scrambled signal according to a predetermined characteristic topological scrambling function and stores said data signal in said predetermined one or more memory cells.

11. A digital signal scrambler as defined in claim 6 wherein said memory circuits are storage registers having respective data outputs connected to respective inputs of said plurality of logic circuits.

12. A digital signal scrambler as defined in claim 11 wherein N equals 24, said plurality of memory circuits is comprised of a pair of 4k byte random access memories, and said plurality of logic circuits is comprised of twenty four 2-input EXCLUSIVE OR gates having inputs connected to respective outputs of each of said random access memories.

13. A digital signal scrambler as defined in claim 11 wherein N equals 24, said plurality of memory circuits is comprised of three 256 byte random access memories, and said plurality of logic circuits is comprised of twenty four 3-input EXCLUSIVE OR gates having inputs connected to respective data outputs of each of said random access memories.

14. A digital signal scrambler as defined in claim 11 wherein said digital input signal is comprised of an X and Y coordinate address signal for addressing a predetermined memory cell in a random access memory, and said scrambled digital output signals is a scrambled address signal for application to said random access memory which in response descrambles said scrambled signal according to a predetermined characteristic topological scrambling function and accesses said predetermined memory cell.

15. A digital signal scrambler as defined in claim 11 wherein said digital input signal is a data signal for storage in a predetermined one or more memory cells of a random access memory, and said scrambled digital output signal is a scrambled data signal for application to said random access memory which in response descrambles said scrambled signal according to a predetermined characteristic topological scrambling function and stores said data signal in said predetermined one or more memory cells.

16. A digital signal scrambler as defined in claim 11 wherein each of said logic circuits is comprised of an EXCLUSIVE OR gate.

17. A digital signal scrambler as defined in claim 16 wherein N equals 24, said plurality of memory circuits is comprised of a pair of 4k byte random access memories, and said plurality of logic circuits is comprised of twenty four 2-input EXCLUSIVE OR gates having inputs connected to respective outputs of each of said random access memories.

18. A digital signal scrambler as defined in claim 16 wherein N equals 24, said plurality of memory circuits is comprised of three 256 byte random access memories, and said plurality of logic circuits is comprised of twenty four 3-input EXCLUSIVE OR gates having inputs connected to respective data outputs of each of said random access memories.

19. A digital signal scrambler as defined in claim 16 wherein said digital input signal is comprised of an X and Y coordinate address signal for addressing a predetermined memory cell in a random access memory, and said scrambled digital output signal is a scrambled address signal for application to said random access memory which in response descrambles said scrambled signal according to a predetermined characteristic topological scrambling function and accesses said predetermined memory cell.

20. A digital signal scrambler as defined in claim 16 wherein said digital input signal is a data signal for storage in a predetermined one or more memory cells of a random access memory, and said scrambled digital ouput signal is a scrambled data signal for application to said random access memory which in response descrambles said scrambled signal according to a predetermined characteristic topological scrambling function and stores said data signal in said predetermined one or more memory cells.

* * * * *